United States Patent [19]
Gardner et al.

[11] Patent Number: 6,144,071
[45] Date of Patent: *Nov. 7, 2000

[54] ULTRATHIN SILICON NITRIDE CONTAINING SIDEWALL SPACERS FOR IMPROVED TRANSISTOR PERFORMANCE

[75] Inventors: Mark I. Gardner, Cedar Creek; H. Jim Fulford, Jr.; Charles E. May, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/146,294

[22] Filed: Sep. 3, 1998

[51] Int. Cl.$^7$ .......................... H01L 29/76; H01L 29/94; H01L 31/062; H01L 27/088
[52] U.S. Cl. .......................... 257/344; 257/408; 257/384; 257/900
[58] Field of Search .................. 257/344, 408, 257/900, 384

[56] References Cited

U.S. PATENT DOCUMENTS

| | | | |
|---|---|---|---|
| 4,743,564 | 5/1988 | Sato et al. | 437/24 |
| 4,908,326 | 3/1990 | Ma et al. | 257/384 |
| 5,089,865 | 2/1992 | Mitsui et al. | 257/388 |
| 5,324,974 | 6/1994 | Liao | 257/344 |
| 5,334,870 | 8/1994 | Katada et al. | 257/344 |
| 5,648,284 | 7/1997 | Kusunoki et al. | 257/344 |
| 5,719,425 | 2/1998 | Akram et al. | 257/344 |
| 5,780,896 | 7/1998 | Ono | 257/344 |
| 5,818,092 | 10/1998 | Bai et al. | 257/388 |
| 5,847,428 | 12/1998 | Fulford, Jr. et al. | 257/344 |
| 5,895,955 | 4/1999 | Gardner et al. | 257/336 |
| 5,905,293 | 5/1999 | Jeng et al. | 257/408 |
| 5,937,315 | 8/1999 | Xiang et al. | 438/486 |

OTHER PUBLICATIONS

Wolf, "Silicon Processing For the VLSI Era, vol. 3: the Submicron MOSFET," Lattice Press, Sunset Beach, California, 1995, pp. 660–661.

Wolf, *Silicon Processing for the VLSI Era, vol. 3: The Submicron Mosfet*, © 1995 by Lattice Press, pp. 642–673.

*Primary Examiner*—Steven H. Loke
*Attorney, Agent, or Firm*—Kevin L. Daffer; Conley, Rose & Tayon

[57] ABSTRACT

A transistor is provided having a pair of sidewall spacers, each preferably including an ultrathin silicon nitride layer, adjacent to opposed sidewall surfaces of a gate conductor on a semiconductor substrate. Each spacer preferably includes a layer of thermally grown silicon nitride, and may also include a silicon dioxide layer. In an embodiment, the spacer includes a first silicon nitride layer adjacent to the sidewall surface, a silicon dioxide layer adjacent to the first silicon nitride layer, and a second silicon nitride layer adjacent to the silicon dioxide layer. Impurity distributions within the substrate may be aligned with any of the layers within the spacer, such that a distribution may be aligned with a sidewall surface or displaced outward from a sidewall surface. Such a distribution may be displaced outward by the lateral width of the spacer or by less than the lateral width of the spacer (i.e. the width of one or more layers within the spacer).

20 Claims, 9 Drawing Sheets

ULTRATHIN SILICON NITRIDE CONTAINING SIDEWALL SPACERS FOR IMPROVED TRANSISTOR PERFORMANCE

BACKGROUND OF THE INVENTION

1. Field of the Invention

This invention relates to integrated circuit fabrication and, more particularly, to a transistor and method for producing a transistor by depositing thin silicon layers and forming thin dielectric sidewall spacers from the deposited silicon layers.

2. Description of the Relevant Art

The use of sidewall spacers to create lightly-doped drain (LDD) regions is a well established technique in MOSFET fabrication. The LDD regions reduce the maximum electric field at the drain/channel interface in the MOSFET. This reduction in electric field reduces the kinetic energy gained by electrons in the MOSFET channel, thereby mitigating undesirable "hot-carrier" effects. These hot-carrier effects include avalanche breakdown at the drain/substrate junction and injection of carriers into the gate dielectric.

Figure 1:
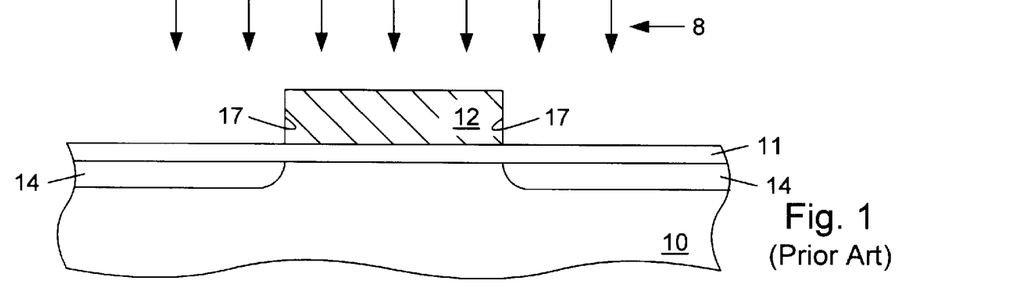
FIG. 1 is a partial cross-sectional view of a semiconductor substrate upon which a gate dielectric is grown, a gate conductor is patterned, and lightly-doped impurity regions are introduced.
Figure 2:
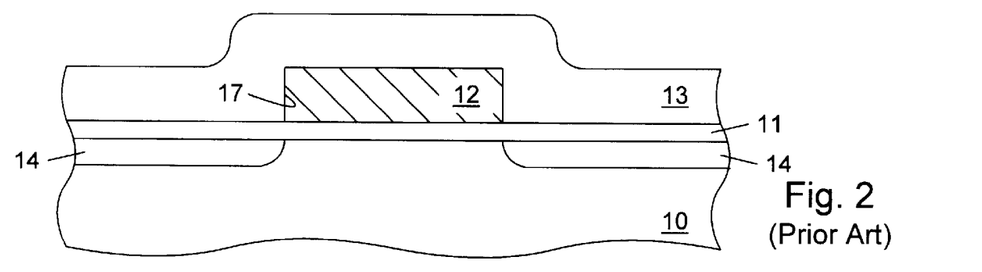
FIG. 2 is a partial cross-sectional view of a semiconductor topography wherein a dielectric layer is deposited over the gate conductor and semiconductor substrate according to a conventional process, subsequent to the steps of FIG. 1.
Figure 3:
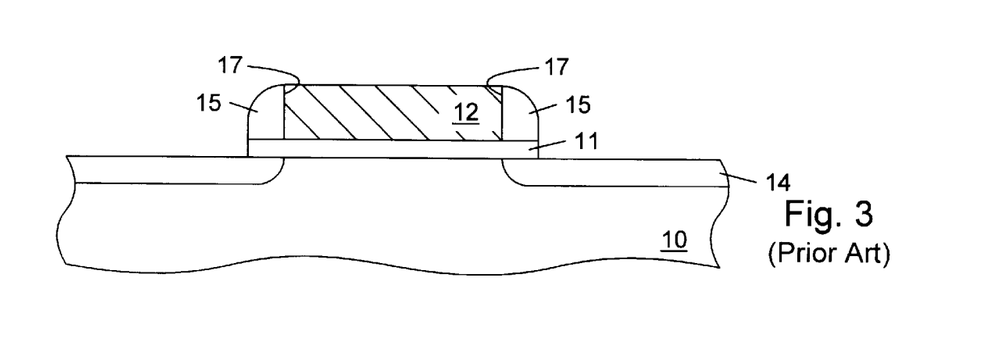
FIG. 3 is a partial cross-sectional view of the semiconductor topography, wherein the dielectric layer is anisotropically etched to form spacers on sidewalls of the gate conductor, subsequent to the step of FIG. 2.
Figure 4:
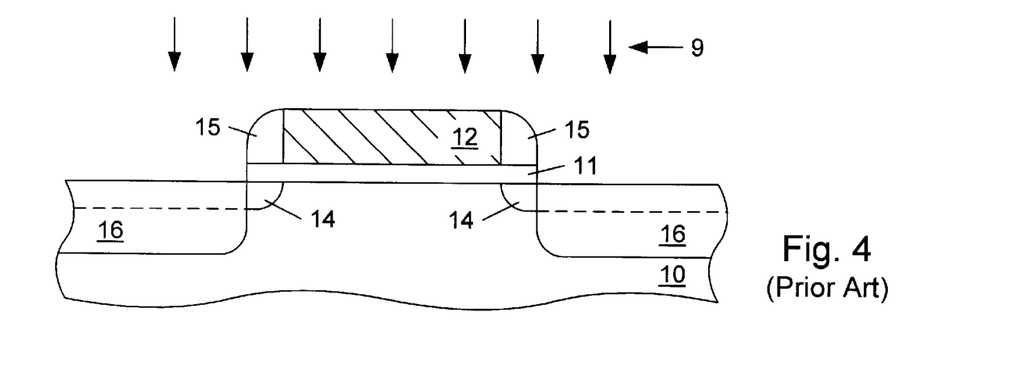
FIG. 4 is a partial cross-sectional view of the semiconductor topography, wherein heavily-doped impurity distributions are introduced, subsequent to the step of FIG. 3.

The formation of lightly-doped drain regions according to a conventional process is illustrated in FIGS. 1–4. A gate conductor 12 having a pair of sidewalls 17 is patterned upon a semiconductor substrate 10 which is covered with a gate dielectric layer 11, as shown in FIG. 1. The semiconductor substrate is typically single-crystal silicon doped n-type or p-type, the gate dielectric is typically silicon dioxide, and the gate conductor is typically polysilicon. An impurity implant 8 self-aligned to the sidewalls 17 of the gate conductor 12 is typically performed in order to form lightly-doped regions 14 adjacent to the channel of the transistor. The implanted impurity is chosen so that the doping of the lightly-doped regions 14 is of opposite type than that of the semiconductor substrate 10. dielectric layer 13, typically silicon dioxide ("oxide"), is then conformally deposited over the gate conductor 12 and the exposed upper surface of gate dielectric 11 by chemical vapor deposition (CVD), as shown in FIG. 2. This oxide layer is then anisotropically etched so that the oxide is preferentially removed from horizontal surfaces, leaving oxide spacers 15 adjacent to the sidewalls 17 of the gate conductor, as shown in FIG. 3. A second impurity implant 9, self-aligned to exposed lateral surfaces of sidewall spacers 15, forms heavily-doped source and drain regions 16 which are displaced from gate conductor 12 by the width of a sidewall spacer 15, as shown in FIG. 4. The lightly-doped region directly under the sidewall spacer at the drain end of the channel reduces the maximum electric field in the device, but the lightly-doped regions also increase the series resistance encountered by electrons or holes traveling from the source to the drain.

As overall dimensions of transistors in integrated circuits are continually shrinking, the lateral widths of sidewall spacers must decrease as well. Excessively wide sidewall spacers result in correspondingly wide lightly-doped regions at the drain and source ends of the channel, which unnecessarily increase the series resistance of the transistor, resulting in decreased saturated drain current and transconductance. Because the conformality of CVD dielectric films is not perfect, sidewall spacers are difficult to form reliably with lateral widths of less than about 400 angstroms, or 0.04 microns. MOSFET gate widths are currently approaching 0.1 microns, so that sidewall spacer widths may comprise a significant portion of the path length between the source and drain regions. It is therefore possible that significant reductions in series resistance may be achieved by making ultrathin (about 200 angstroms wide or less) sidewall spacers. It would therefore be desirable to develop a method for reliably forming such ultrathin sidewall spacers for MOSFET fabrication.

SUMMARY OF THE INVENTION

The problems outlined above are addressed by employing a process of forming ultrathin sidewall spacers from deposited silicon layers. A gate structure may be formed above a semiconductor substrate. In one embodiment, impurities are introduced using the gate structure as a mask. A silicon layer may be deposited over the gate structure, and a silicon nitride, oxide, or oxynitride layer then formed from the silicon layer by heating the layer in nitrogen-bearing and/or oxygen-bearing ambients. Because CVD of silicon is believed to result in more conformal deposition than CVD of dielectrics in general, it is believed that thinner dielectric layers can be made reliably by this method. Because the gate structure is preferably made from polysilicon, it is possible that the process of forming the thin dielectric could consume portions of the gate structure. In the case of silicon nitride formation in an $NH_3$ ambient, however, this may be substantially prevented by the self-limiting nature of the thermal nitridation process in silicon. The low diffusivity of nitrogen in silicon nitride limits the thickness of thermally grown silicon nitride using $NH_3$ to about 100 angstroms when grown from single-crystal silicon, and about 200 angstroms when grown from polycrystalline or amorphous silicon. Oxide and oxynitride growth using oxygen-bearing ambients is not believed to be self-limited in the way that nitride growth is. However, extremely low oxidation rates may be obtainable using techniques including reduced pressure oxidation and rapid thermal processing. Therefore, it may be possible to form thin oxides and oxynitrides from a thin silicon layer deposited over a polysilicon gate, although much greater care would be required than for forming silicon nitride. Anisotropic etching of the resulting thin, conformal dielectric layer formed from the thin silicon layer may then produce extremely thin dielectric spacers adjacent to sidewalls of the gate structure.

In addition to forming an ultrathin spacer through a self-limiting process, thermally-grown silicon nitride is believed to provide reliability advantages as compared to deposited oxides or nitrides. Silicon nitride is more effective than oxide as a diffusion barrier to many impurities, so that impurities in a silicon substrate may be prevented from diffusing into an adjacent silicon nitride layer. This diffusion blocking capability may be especially significant in the case of p-channel transistors, which are typically implanted with boron. Boron is known to exhibit significant outdiffusion from silicon into overlying oxide layers during MOSFET fabrication. Use of silicon nitride rather than oxide spacers may help limit this outdiffusion.

The presence of nitrogen in a sidewall spacer is also believed to limit the "bridging" that can occur during self-aligned silicide, or salicide, formation. In a salicide process, a metal film is blanket-deposited over the exposed surfaces of the transistor after formation of the source and drain regions. The transistor is then subjected to a heating process which causes a reaction between the metal and silicon that the metal is in contact with, forming a silicide on the silicon surfaces. Unreacted metal is then removed, leaving the silicide covering the gate, source, and drain regions. In some cases, however, a silicide connection, or "bridging", can occur across oxide sidewall spacers between the gate and source or drain regions. Bridging can occur when silicon atoms from the gate, source and/or drain regions diffuse into the metal overlying the sidewall spacers, so that a silicide is formed on the spacers. Titanium salicide processes are particularly prone to bridging, but the presence of nitrogen is known to reduce the diffusivity of silicon atoms in titanium, and thereby suppress bridging. It is therefore believed that forming sidewall spacers from silicon nitride rather than silicon dioxide provides nitrogen needed to limit bridging in titanium salicide processes.

When thermal nitridation is used to form spacers as described above, the spacers produced are made of thermally grown silicon nitride, which is believed to be more stoichiometric and denser, and contain less hydrogen than nitride deposited by CVD methods. Silicon nitride films can contain up to 30 atomic percent hydrogen when applied using plasma-enhanced CVD (PECVD) at temperatures of 300–400° C., and up to 8 atomic percent hydrogen when applied by low-pressure CVD (LPCVD) at 700–800° C. Hydrogen atoms from a silicon nitride layer can migrate to other areas of a transistor during fabrication and/or operation, causing, for example, shifts in threshold voltage. Significant hydrogen incorporation can also degrade the etching characteristics of silicon nitride films. In the event that a contact hole through an overlying dielectric is misaligned to overlap with a spacer, for example, lowered resistance to etchants could result in damage to spacers during etching of such a contact hole. Silicon nitride sidewall spacers produced by the above-described embodiment may therefore be more resistant to etchants and less likely to cause reliability problems such as threshold voltage shifts than spacers formed using conventional deposited dielectric processes.

Impurity introduction may be performed at various stages in the process, including before the silicon deposition, after etching of the dielectric layer to form the sidewall spacers, and through the thin dielectric layer before etching. Introduction of impurities through a silicon nitride layer by, for example, ion implantation may be advantageous for impurities such as boron, commonly used in p-channel transistors, which outdiffuse from silicon into overlying layers. As discussed above, silicon nitride is an effective diffusion barrier and is believed to prevent outdiffusion of boron and other impurities from a substrate.

In the case of silicon nitride layer formation, the silicon deposition and thermal nitridation processes described above may be repeated in order to increase the thickness of the silicon nitride layer to make silicon nitride sidewall spacers having a lateral width greater than about 200 angstroms. When spacers are built up from separate silicon nitride layers in this manner, impurity implants may be performed before or after each silicon nitride layer is formed. In this way, graded source and drain impurity distributions may be formed. After formation of the first silicon nitride layer, subsequent silicon layers deposited may be annealed in an oxygen-bearing ambient to form oxide rather than silicon nitride. Because oxygen has a low diffusivity in silicon nitride, presence of the silicon nitride layer is believed to limit oxidation to the deposited silicon layer, protecting the underlying conductive gate from oxidation. One feature of oxide that is attractive for spacer formation is the lower relative permittivity of oxide as compared to silicon nitride. This lower permittivity reduces the strength of fringing electric fields in a spacer, and reduces the parasitic gate-to-source/drain capacitance associated with the spacer. A combination of silicon nitride and oxide layers in the sidewall spacers is therefore believed to allow the reduced parasitic capacitance and fringing fields associated with oxide to be combined with the enhanced reliability obtainable using silicon nitride.

In a preferred embodiment of the process, the semiconductor substrate is monocrystalline silicon. A gate oxide is grown on the semiconductor substrate, and a polysilicon layer is deposited over the gate oxide. The polysilicon layer is then patterned to form a gate structure. Lightly doped regions of a type opposite to that of the substrate are formed by impurity implantation using the gate structure as a mask. A thin oxide (about 25 to about 100 angstroms thick), which may serve as an optional pad oxide for the nitride layer to be formed, is then grown on the polysilicon gate structure. A thin polysilicon layer (about 50 to about 200 angstroms thick) is then blanket-deposited over the gate structure and substrate. This polysilicon layer is annealed in an $NH_3$-containing ambient at a temperature in the range of about 850° C. to about 1100° C. and for a time in the range of about 30 seconds to about 3 minutes. This anneal is believed to convert the polysilicon layer to a thin layer of silicon nitride. Anisotropic etching of the silicon nitride layer is then performed, to form silicon nitride spacers having extremely small lateral widths of approximately 200 angstroms or less adjacent to sidewalls of the gate structure. Heavily doped regions of a type opposite to that of the substrate are formed by impurity implantation using the gate structure and spacers as a mask. These regions combine with the lightly doped regions described above to form source and drain regions having extremely narrow lightly doped portions on each end of the channel. The series resistance of the transistor is therefore lowered in comparison to that of a comparable device having conventional wider spacers, resulting in higher saturated drain current and transconductance for the transistor. After removal of any remaining dielectric from the upper surfaces of the gate structure and source and drain regions, a metal layer is blanket deposited over the gate structure, spacers and substrate. The transistor is heated so that the metal layer reacts to form a silicide in areas where the metal is in contact with silicon. Unreacted metal is then removed, leaving metal silicide contact regions on the gate, source and drain regions of the transistor. The presence of nitrogen in the spacers is believed to provide reliability benefits including reduction of impurity outdiffusion from the source and drain regions, reduction of the Si diffusion that can cause bridging when titanium salicidation is used, and resistance to oxide-selective etchants which may be used during etching of openings in overlying oxide layers.

In an alternative embodiment of the above process, the gate oxide not covered by the gate conductor is removed before deposition of the thin polysilicon layer, and the heavily doped regions are implanted through the silicon nitride layer before the anisotropic etching. This provides a silicon nitride layer over the substrate during the implantation (and subsequent anneal for electrical activation) of the heavily doped regions. The silicon nitride is believed to form a barrier to outdiffusion of the implanted impurities during the implant and anneal.

In an alternative embodiment, an additional thin polysilicon layer is deposited over the silicon nitride layer, before the anisotropic etching. This additional polysilicon layer is then converted to silicon nitride by annealing in an $NH_3$-containing ambient, and the deposition and annealing of additional polysilicon layers may be repeated. In this manner, thicker silicon nitride layers (beyond the 200 angstrom limit for a single nitridation) may be built up, so that wider spacers are formed by the anisotropic etch process.

In an alternative embodiment, an additional polysilicon layer may be annealed in an oxygen-containing ambient for conversion to oxide. Oxide spacers with controlled thickness are difficult to form directly on the polysilicon gate structure by thermal oxidation of polysilicon, because, unlike nitridation, thermal oxidation is not self-limiting. The presence of a silicon nitride layer, however, between the polysilicon gate structure and a thin polysilicon layer to be oxidized, protects the polysilicon gate structure from being consumed during the oxidation process. Because the relative permittivity of oxide is lower than that of silicon nitride by about a factor of 2, transistors with oxide spacers are less affected by fringing fields in the spacers and parasitic capacitance between the gate and source-drain regions. Elective oxidation or nitridation of additional polysilicon layers allows combination of the reliability benefits of silicon nitride with the lower permittivity of oxide. A preferred embodiment for a nitride/oxide combination spacer structure is a sequence in which a nitride layer is formed by deposition/annealing of polysilicon, followed by an oxide layer, followed by another nitride layer. In this way, nitrogen is present on the peripheral surfaces of the spacer where it may be useful for the reliability enhancements discussed above, while the inner portion of the spacer consists substantially of oxide.

As is partially illustrated by the preceding embodiments, the process recited herein may allow extreme flexibility in tailoring the thickness and composition of ultrathin spacers. Any number of polysilicon layers may be deposited and converted to silicon nitride, silicon dioxide, or silicon oxynitride, by heating in appropriate ambients, as described above. In the above embodiments for which more than one polysilicon layer is deposited, impurities may be implanted before each polysilicon layer deposition to form graded doping profiles under the spacers. Alternatively, the lightly doped implant normally self-aligned to the gate conductor in an LDD process may be offset from the gate conductor by the width of one or more thin dielectric layers, and an additional dielectric layer may be subsequently formed for masking of the heavily doped implant in the LDD process. This procedure may be useful in limiting shortening of the channel by diffusion of impurities during subsequent processing steps. In other words, impurities may diffuse into the thin region under the offsetting dielectric layer rather than diffusing into the channel. After introduction of the heavily-doped impurity distribution in an LDD process, one or more additional dielectric layers may be formed so that the spacers in the finished transistor extend beyond the edge of the heavily-doped distribution. This embodiment may be useful in providing a wider spacer to mask a subsequent salicide process. The reliability of the salicide process may be enhanced by the wider spacer, while the narrow lightly-doped portions of the source and drain regions are maintained, thereby providing a low series resistance for the transistor.

Spacers including multiple dielectric layers may be formed either by first forming the desired number of dielectric layers and then selectively removing portions of the layers to form spacers in one removal step (preferably anisotropic etching), or by selectively removing portions of each dielectric layer after it is formed. These two methods may also be combined. For example, three dielectric layers may be formed by subsequent deposition and annealing of polysilicon layers, the three layers may then be anisotropically etched in one step to form spacers, a fourth dielectric layer may then be formed over the gate conductor, spacers, and substrate, and the fourth dielectric layer may then be anisotropically etched such that wider spacers are formed. Although forming all of the desired dielectric layers before anisotropic etching saves process steps, etching of individual layers may result in different shapes of the portions of the layers which remain in the finished spacer. The ability to control these layer shapes may be usefull, particularly when different dielectrics are combined to form the spacers.

It should be noted that the ability to form extremely thin dielectric layers and spacers using the process disclosed herein is believed to allow the formation of spacers which contain multiple dielectric layers, such as described in the above embodiments, without having prohibitively large lateral widths. Formation of multiple-layer spacers using solely conventional CVD dielectric layer deposition, on the other hand, is believed to result in significantly wider spacers than are obtained using the method disclosed herein. These wider spacers may result in increased series resistance and degraded performance of a transistor.

A transistor having ultrathin spacers formed from deposited silicon layers is also contemplated herein. In an embodiment in which the ultrathin spacers are silicon nitride, the spacers result in improved performance and reliability of the transistor, as described above. In an alternative embodiment, the transistor includes spacers having both thermal silicon nitride and thermal oxide layers. The transistor may also include one or more implanted impurity distributions under each spacer.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 5:
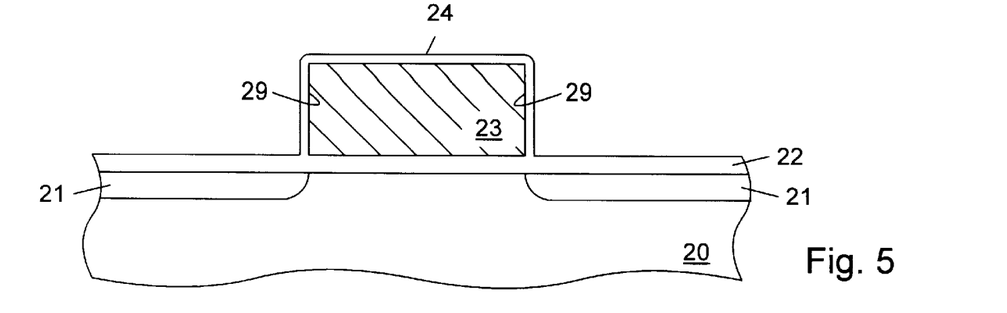
FIG. 5 is a partial cross-sectional view of a semiconductor topography according to one embodiment hereof, wherein an oxide layer is grown or deposited on exposed surfaces of a gate conductor.

Turning to the drawings, FIG. 5 illustrates a partial cross-section of a semiconductor topography including a gate conductor 23 having a pair of sidewalls 29 patterned over a semiconductor substrate 20 that is covered with a gate dielectric layer 22. Although not shown, there may be numerous dielectric isolation regions formed within substrate 20 at spaced distances from gate conductor 23. Methods of forming the isolation regions may include dielectric deposition to fill trenches etched into the substrate and local oxidation of silicon. The isolation regions and gate conductor 23 may serve to self-align impurities introduced into substrate 20 using various well known techniques. As shown in FIG. 5, lightly doped impurity distributions 21 may be formed, self-aligned to sidewalls 29 of gate conductor 23. Impurity distributions 21 are preferably formed through ion implantation. Lightly-doped impurity distributions 21 provide lightly doped portions of source and drain regions formed on each side of the gate conductor. The doping of regions 21 is of opposite type to that of semiconductor substrate 20. For an n-channel device, for example, substrate 20 is p-type and regions 21 are n-type. Typical n-type dopants include arsenic and phosphorus, while boron is a typical p-type dopant.

Semiconductor substrate 20 is preferably silicon, and is doped either n-type (for producing a p-channel transistor) or p-type (for an n-channel transistor). Gate dielectric 22 is preferably thermally grown silicon dioxide, which may be grown by heating the substrate to a temperature of greater than about 700° C. in an oxidizing ambient such as $O_2$ or $H_2O$. Other gate dielectrics may be used, however, including silicon nitride, silicon oxynitride or nitrided silicon dioxide. Gate dielectric 22 may also include deposited $SiO_2$. Gate conductor 23 is preferably patterned from a polysilicon layer in a range from about 1000 angstroms to about 2000 angstroms thick. Polysilicon layer 23 may be deposited using CVD of silicon from, for example, a silane source. Thin oxide layer 24, preferably in the range from about 25 angstroms to about 100 angstroms thick, is grown or deposited over gate conductor 23. Oxide 24 is preferably thermally grown as described above for gate oxide 22, in order to achieve a high quality oxide with good thickness control. However, oxide layer 24 may also be deposited using techniques such as LPCVD at substrate temperatures in a range from about 650° C. to about 900° C. and PECVD at substrate temperatures from about 200° C. to about 400° C. Oxide 24 may function as an optional pad oxide for an overlying silicon nitride layer, and may be omitted in another embodiment of the process.

Figure 6:
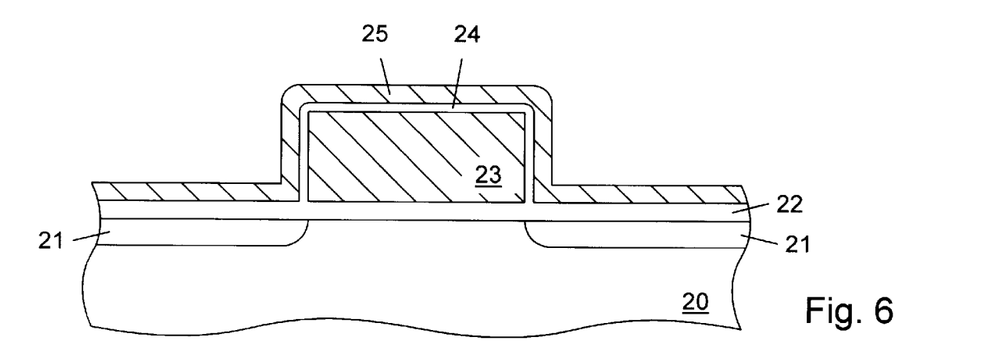
FIG. 6 is a partial cross-sectional view of the semiconductor topography, wherein a silicon layer is deposited across the exposed surfaces of the topography, subsequent to the step of FIG. 5.

A thin silicon layer 25 may then be deposited over exposed upper surfaces of the semiconductor topography, as shown in FIG. 6. Silicon layer 25 is preferably between about 50 angstroms and about 200 angstroms thick, and is deposited by LPCVD using a silane source in a temperature range from about 580° C. to about 650° C., and at a pressure of less than about 2 torr. Under these conditions, silicon layer 25 is preferably formed as polycrystalline silicon. An amorphous silicon film, as would be obtained through deposition at lower temperatures, may also be used, and silicon layer 25 may also be deposited by other techniques such as PECVD.

Figure 7:
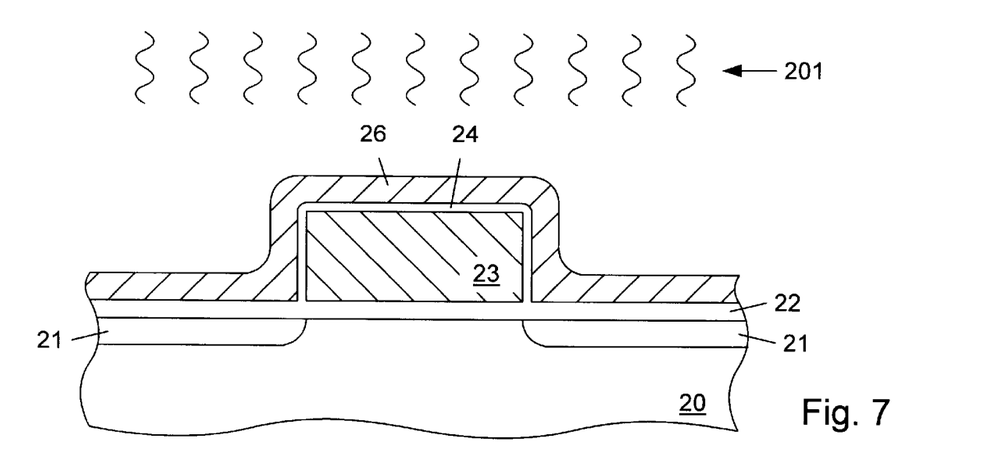
FIG. 7 is a partial cross-sectional view of the semiconductor topography, wherein a thermal process is used to convert the silicon layer to a dielectric layer, subsequent to the deposition shown in FIG. 6.

Thermal process 201 may then be performed to convert silicon layer 25 to dielectric layer 26, as shown in FIG. 7. Thermal process 201 preferably includes heating in an $NH_3$ ambient to a temperature between about 850° C. and 1100° C., for a time from about 30 seconds to about 3 minutes. The heating is preferably performed in a rapid thermal annealing (RTA) system, but may be performed in other types of furnace as well. Under these conditions, a high-quality silicon nitride layer may be formed, and the silicon nitride layer thickness is limited to about 200 angstroms because of the limited diffusivity of nitrogen in silicon nitride. As such, the silicon nitride layer may have a thickness comparable to silicon layer 25 from which it is formed. Alternatively, thermal process 201 may include other ambients such as $N_2$, an $NH_3$ plasma, or an $N_2$—$H_2$ plasma. These processes, however, may not result in a self-limited thickness of the silicon nitride layer, and might therefore require more precise process control in order avoid unwanted consumption of gate conductor 23. Optional oxide layer 24 may be converted to a nitrided oxide or oxynitride by thermal process 201. The silicon nitride layer is a thermally grown silicon nitride, and as such is believed to have a higher density, lower hydrogen content, and greater resistance to oxide etchants than do conventional deposited silicon nitride films, particularly those deposited by PECVD.

In an alternate embodiment, thermal process 201 may be performed in an oxidizing ambient such as $O_2$ or $H_2O$, so that layer 26 is an oxide layer. Because thermal oxidation of silicon is not self-limiting in thickness of the oxide layer, very precise control over oxidation rate is required in this embodiment to avoid consumption of gate conductor 23. This may be possible, for example, using low-growth-rate oxidation techniques such as low pressure oxidation and rapid thermal processing. Similarly, a thermal process in an ambient which is both nitrogen-bearing and oxidizing may be performed to form an oxynitride layer from deposited silicon layer 25, although this process is also believed to be not self-limiting and would therefore require precise process control.

Figure 8:
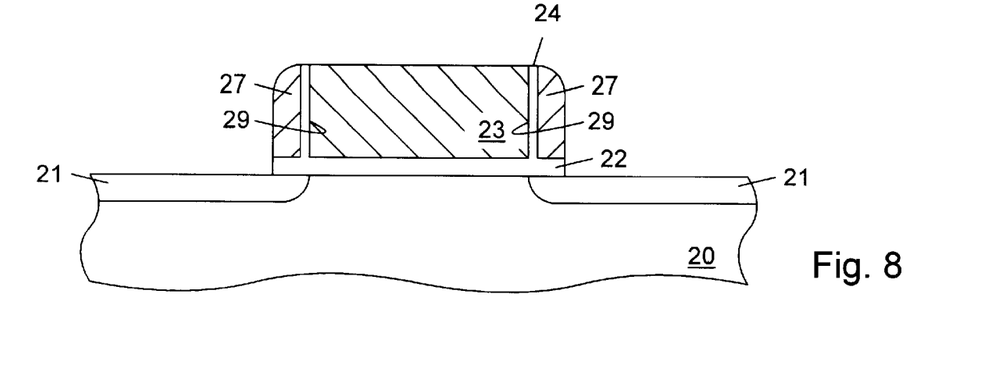
FIG. 8 is a partial cross-sectional view of the semiconductor topography, wherein portions of the dielectric and oxide layers are anisotropically removed to form spacers on sidewalls of the gate conductor, subsequent to the thermal process shown in FIG. 7.

Turning to FIG. 8, substantially horizontal portions of dielectric layer 26 are selectively removed. Vertical portions of layer 26 remain to form spacers 27 spaced from sidewalls 29 of gate conductor 23 by the thickness of optional oxide layer 24. Spacers 27 have a thickness of no more than about 200 angstroms, if formed by heating in an $NH_3$ ambient. The selective removal of the horizontal portions of layer 26 is preferably accomplished using an anisotropic etch process, typically an ion-assisted etching process, in which etching occurs more rapidly in a vertical direction than in a horizontal direction. In the embodiment shown in FIG. 8, the portion of gate dielectric 22 not covered by gate conductor 23, oxide 24, or spacers 27 is removed along with horizontal portions of layer 26. In an alternate embodiment, these portions of gate dielectric 22 may be left in place for subsequent processing steps, as long as they are removed before formation of contacts to the source and drain regions.

Figure 9:
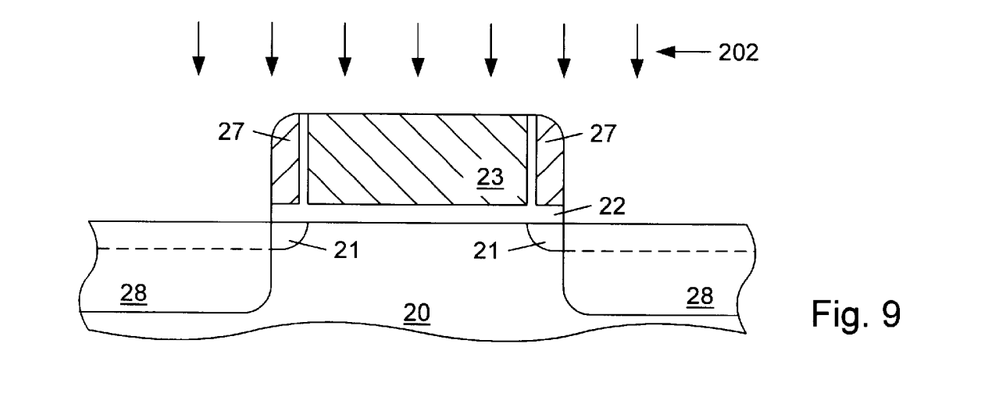
FIG. 9 is a partial cross-sectional view of the semiconductor topography, wherein heavily-doped impurity distributions are introduced into the semiconductor substrate, subsequent to the selective removal shown in FIG. 8.

After spacer formation, impurity introduction 202, preferably an ion implantation, may be performed, as shown in FIG. 9. Impurity introduction 202 is preferably self-aligned to exposed lateral sidewalls of spacers 27 to form heavily-doped impurity regions 28. The doping of impurity regions 28 is of the same type as that of impurity regions 21. Impurity regions 28 and 21 combine to form source and drain regions having lightly-doped portions directly under spacers 27. The lightly-doped portions preferably have a lateral width comparable to that of spacers 27, preferably no more than about 200 angstroms. These narrow lightly-doped portions may allow the series resistance of the transistor to be lowered in comparison to that of a comparable device having conventional wider spacers, resulting in higher saturated drain current and transconductance for the transistor.

Figure 10:
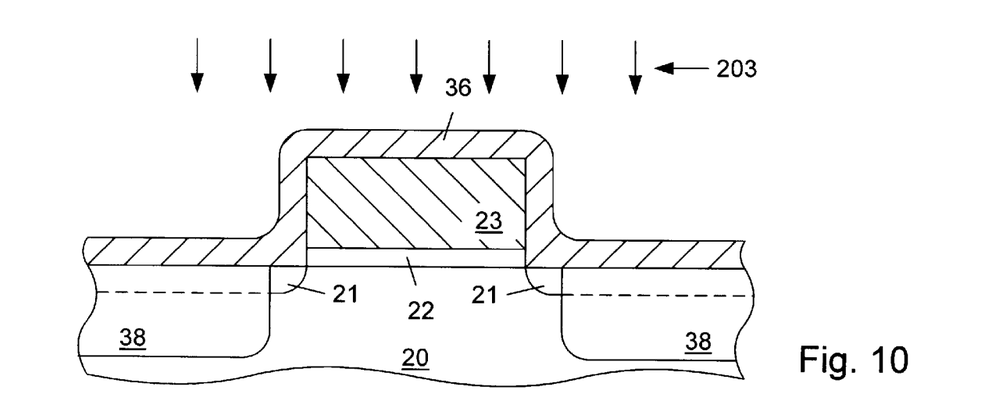
FIG. 10 is partial cross-sectional view of the semiconductor topography in an alternate embodiment, wherein no oxide is grown upon the gate conductor and the exposed gate dielectric is removed before deposition of the silicon layer, and wherein the heavily-doped impurity distributions are introduced through the dielectric layer and annealed, prior to the anisotropic removal shown in FIG. 8.

An alternate embodiment of the process is illustrated in FIG. 10. In this embodiment, the exposed portion of gate dielectric 22 is removed after patterning of gate conductor 23 over substrate 20. Furthermore, no oxide layer is formed over gate conductor 23 before deposition of a thin silicon layer over the gate conductor and substrate. Dielectric layer 36 is formed from the thin silicon layer using a thermal process. Impurity introduction 203, preferably an ion implantation, is performed through the thin horizontal portions of layer 36 to form heavily-doped impurity regions 38. In this embodiment, dielectric layer 36 may be a silicon nitride layer provided directly above impurity regions 38. The silicon nitride layer may act as a diffusion barrier for impurities in regions 38 and 21, preventing them from diffusing up out of substrate 20. Increased source and drain resistance caused by outdiffusion of impurities may thereby be avoided. Because boron is particularly known for outdiffusion from silicon into overlying oxide layers, this embodiment is believed to be particularly useful for p-channel transistors in which boron doping is used in the source and drain regions. Portions of layer 36 may then be selectively removed to form spacers similar to spacers 27 shown in FIG. 9.

Figure 11:
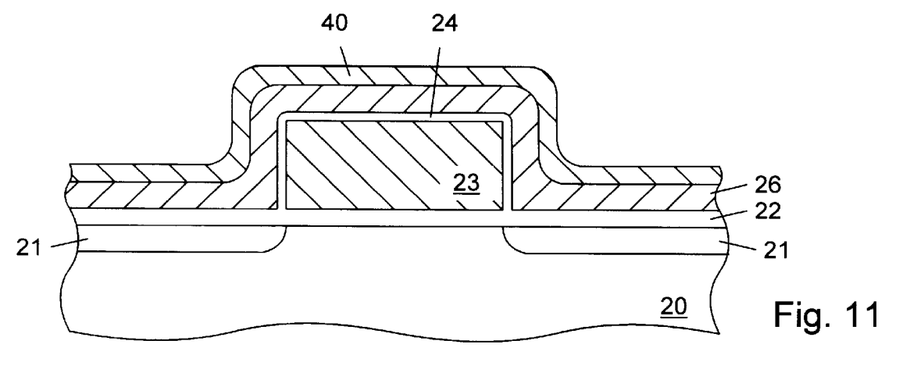
FIG. 11 is a partial cross-sectional view of the semiconductor topography in an alternate embodiment, wherein a second silicon layer is deposited on an upper surface of the dielectric layer, subsequent to the thermal process shown in FIG. 7.

An alternate embodiment of the process is shown in FIG. 11. In this embodiment, dielectric layer 26, preferably silicon nitride, is formed over gate conductor 23 and substrate 20, as shown in FIGS. 5 through 7. A second silicon layer 40 may then be deposited over dielectric layer 26. This silicon layer, preferably polysilicon, may be similar to silicon layer 25 shown in FIG. 6.

Figure 12:
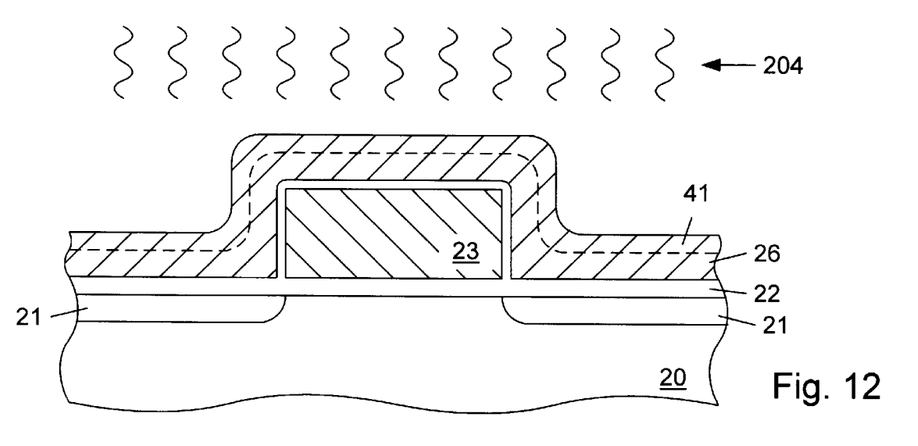
FIG. 12 is a partial cross-sectional view of the semiconductor topography, wherein a thermal process converts the second silicon layer to a dielectric layer, subsequent to the deposition of FIG. 11.
Figure 13:
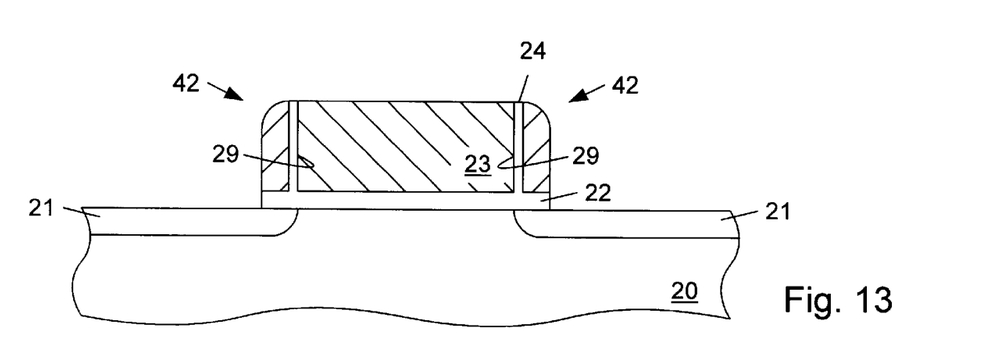
FIG. 13 is a partial cross-sectional view of the semiconductor topography, wherein portions of the dielectric and oxide layers are selectively removed to form spacers on the sidewalls of the gate conductor, subsequent to the thermal process of FIG. 12.

Thermal process 204 is then performed such that silicon nitride layer 41 is formed, as shown in FIG. 12. Thermal process 204 is preferably an anneal in a NH$_3$ ambient, similar to process 201 shown in FIG. 7. Substantially horizontal portions of layers 26 and 41 may then be selectively removed, leaving spacers 42, as shown in FIG. 13. In this manner, silicon nitride spacers may be formed having lateral width greater than the upper limit of approximately 200 angstroms imposed by the self-limiting nature of a single thermal nitridation process. When formed from annealing in an NH$_3$ ambient, spacers 42 in FIG. 13 are believed to have a lateral width of no more than about 400 angstroms.

Figure 14:
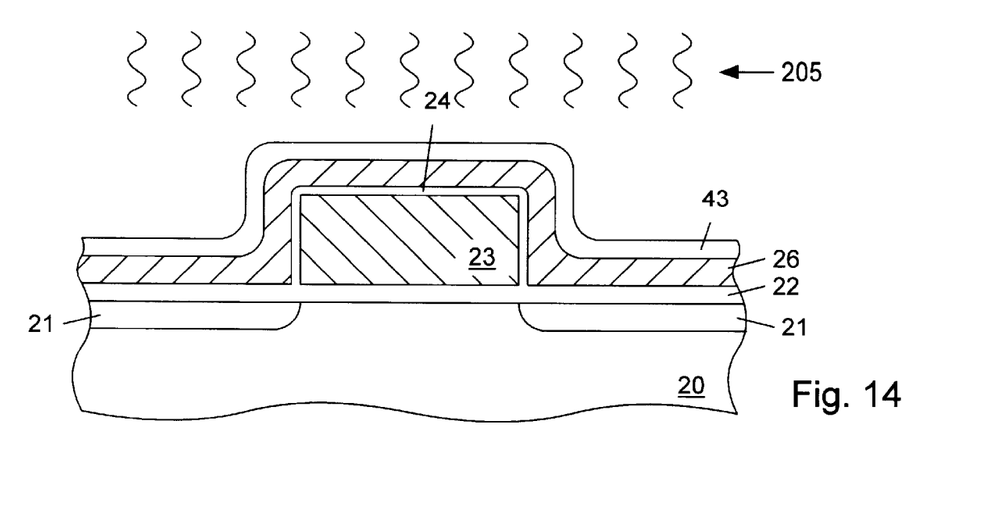
FIG. 14 is a partial cross-sectional view of the semiconductor topography in an alternate embodiment, wherein annealing in an oxygen-bearing ambient converts the second silicon layer to silicon dioxide, subsequent to the deposition shown in FIG. 11.
Figure 15:
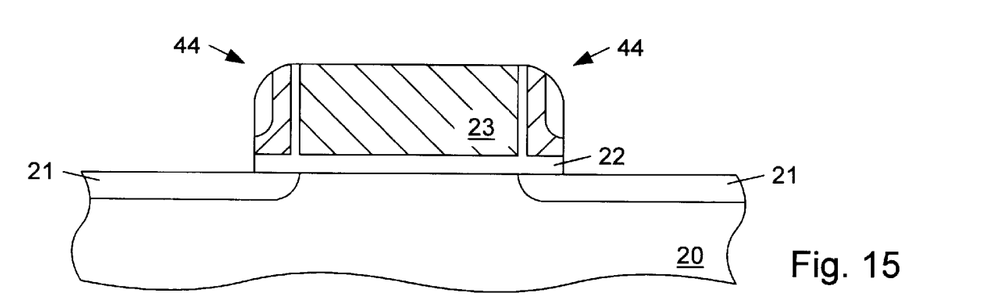
FIG. 15 is a partial cross-sectional view of the semiconductor topography, wherein portions of the silicon dioxide and dielectric (preferably silicon nitride) layers are anisotropically removed to form spacers on the sidewalls of the gate conductor, subsequent to the annealing shown in FIG. 14.

In an alternate embodiment, shown in FIG. 14, a silicon dioxide layer 43 is instead formed from second silicon layer 40 (shown in FIG. 11) deposited over dielectric layer 26 and subjected to thermal process 205. Thermal process 205 preferably includes heating in an oxidizing ambient. Although thermal oxidation may not be self-limiting, dielectric layer 26 may be a silicon nitride layer which is believed to protect underlying layers from oxidation because of a low diffusivity of oxygen in silicon nitride. In this way, only the second deposited silicon layer is oxidized. Substantially horizontal portions of layers 26 and 43 are then selectively removed, preferably using anisotropic etching, as shown in FIG. 15. The remaining portions of layers 26 and 43 form spacers 44, which preferably contain both silicon nitride and silicon dioxide. The presence of silicon dioxide in spacers may be beneficial because of the lower relative permittivity of silicon dioxide as compared to silicon nitride. This lower permittivity is believed to lessen the strength of fringing electric fields between gate and source/drain regions of a transistor, and to reduce parasitic capacitance between the gate and source/drain regions.

Figure 16:
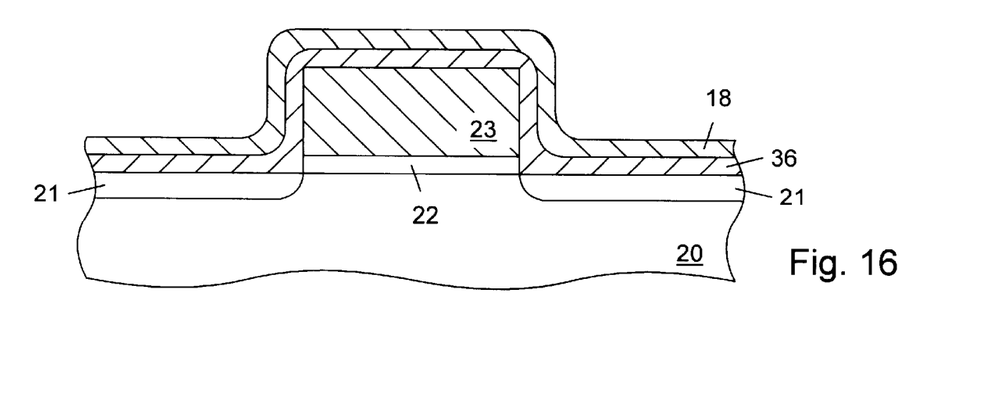
FIG. 16 is a partial cross-sectional view of the semiconductor topography in an alternate embodiment, wherein no oxide is grown on the gate conductor and the exposed gate dielectric is removed before deposition of a first silicon layer, and wherein the first silicon layer is annealed in a nitrogen-bearing ambient to form silicon nitride, and a second silicon layer is deposited over the silicon nitride layer.
Figure 17:
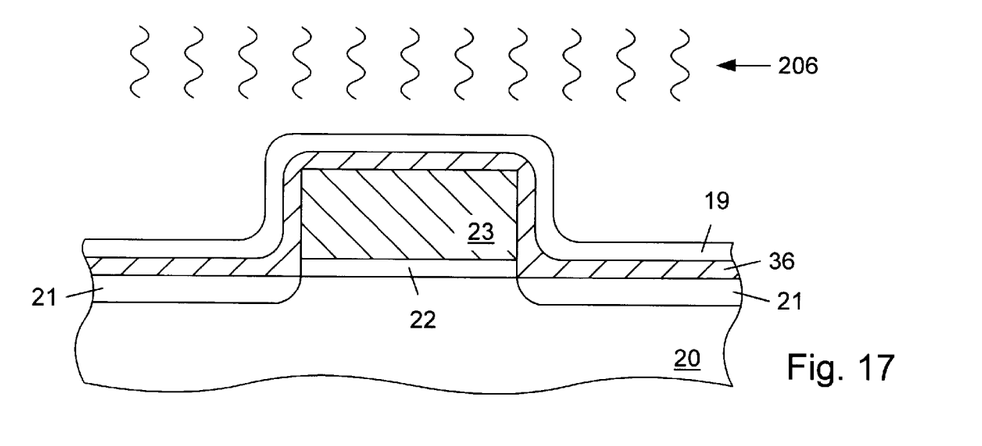
FIG. 17 is a partial cross-sectional view of the semiconductor topography wherein the second silicon layer is annealed in an oxidizing ambient to form silicon dioxide, subsequent to the second silicon layer deposition shown in FIG. 16.
Figure 18:
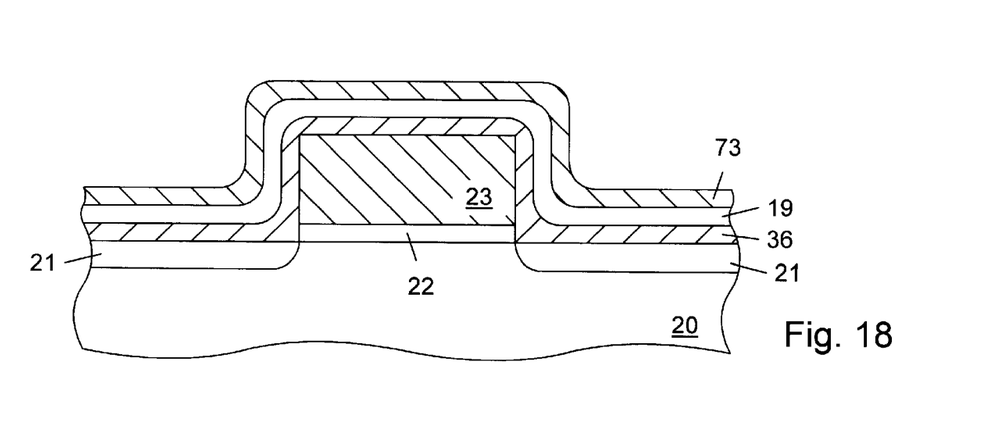
FIG. 18 is a partial cross-sectional view of the semiconductor topography wherein a third silicon layer is deposited over the silicon dioxide layer, subsequent to the annealing shown in FIG. 17.
Figure 19:
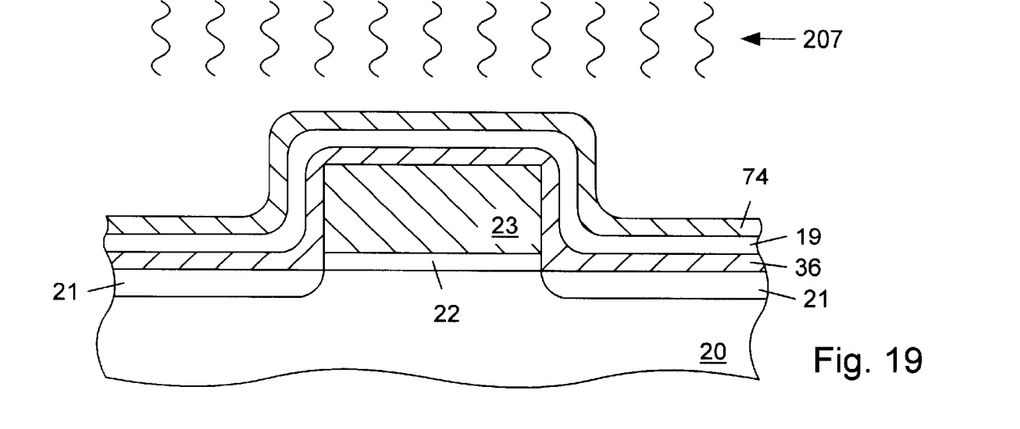
FIG. 19 is a partial cross-sectional view of the semiconductor topography wherein the third silicon layer is annealed in a nitrogen-containing ambient to form a second silicon nitride layer, subsequent to the deposition shown in FIG. 18.

A currently preferred embodiment including spacers containing both silicon dioxide and silicon nitride layers is shown in FIGS. 16 through 20. In FIG. 16, as for the embodiment shown in FIG. 10, the exposed portion of gate dielectric 22 is removed after patterning of gate conductor 23 over substrate 20. Furthermore, no oxide layer is formed over gate conductor 23 before formation of dielectric layer 36 by deposition and heat treatment of a thin silicon layer. Silicon layer 18 is deposited over dielectric layer 36, which is preferably a silicon nitride layer. Silicon dioxide layer 19 is then formed from silicon layer 18 using thermal process 206, as shown in FIG. 17. Thermal process 206 preferably includes heating in an oxidizing ambient, such as O$_2$ or H$_2$O. Thin silicon layer 73 is then deposited over silicon dioxide layer 19, as shown in FIG. 18. Silicon nitride layer 74 is formed from silicon layer 73 using thermal process 207, as shown in FIG. 19. Thermal process 207 preferably includes heating in an NH$_3$ ambient.

Figure 20:
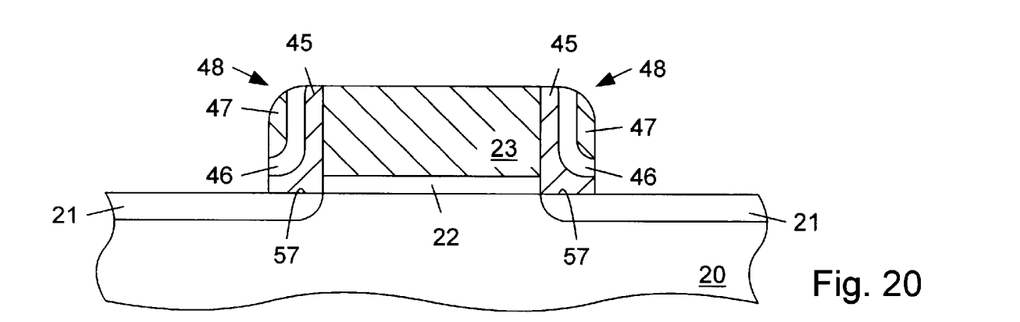
FIG. 20 is a partial cross-sectional view of the semiconductor topography wherein portions of the silicon nitride, silicon dioxide and second silicon nitride layers are anisotropically removed to form spacers, subsequent to the annealing shown in FIG. 19.

Portions of layers 36, 19, and 74 are then selectively removed to form spacers 48, as shown in FIG. 20. Spacers 48 contain regions 45, 46, and 47, which are the remaining portions of layers 36, 19, and 74, respectively. In the case in which dielectric layer 36 is silicon nitride, spacers 48 are believed to provide improved performance by combining the enhanced reliability associated with silicon nitride with the lower relative permittivity of silicon dioxide. For example, the horizontal portions of silicon nitride regions 45 which form the lower surfaces 57 of spacers 48 are believed to prevent outdiffusion of impurities from substrate 20. Silicon nitride regions 47, which form parts of the exposed surfaces of spacers 48, are believed to assist in prevention of bridging in the event of titanium silicide formation, since these layers provide nitrogen to the exposed spacer surfaces. Silicon nitride regions 47 are also believed to make the spacers more resistant to etchants such as those which may be used to etch contact holes through an overlying oxide. Silicon dioxide regions 46, which form much of the interiors of spacers 48, are believed to provide lowered fringing fields and parasitic capacitance between gate conductor 23 and the source and drain regions (only lightly-doped portions 21 are shown) typically arranged on each side of a gate conductor.

As partially illustrated by the preceding embodiments, the process recited herein allows extreme flexibility in tailoring the thickness and composition of ultrathin spacers. Any number of silicon layers may be deposited and converted to silicon nitride, silicon dioxide, or silicon oxynitride, by heating in appropriate ambients as described above.

Figure 21:
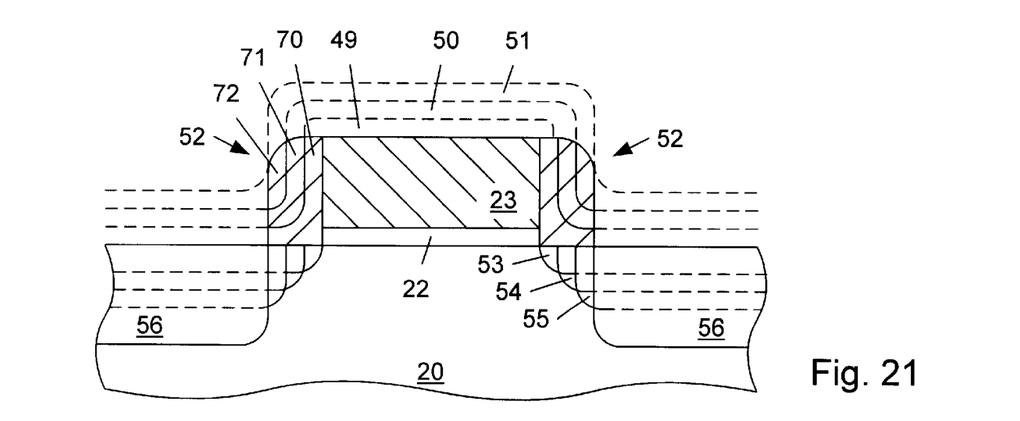
FIG. 21 is a partial cross-sectional view of the semiconductor topography in an alternate embodiment, wherein silicon nitride spacers are formed from deposition and annealing of three successive silicon layers, and wherein an impurity distribution is formed before deposition of each silicon layer and after etching to form the sidewall spacers, so that a graded impurity profile is formed.
Figure 22:
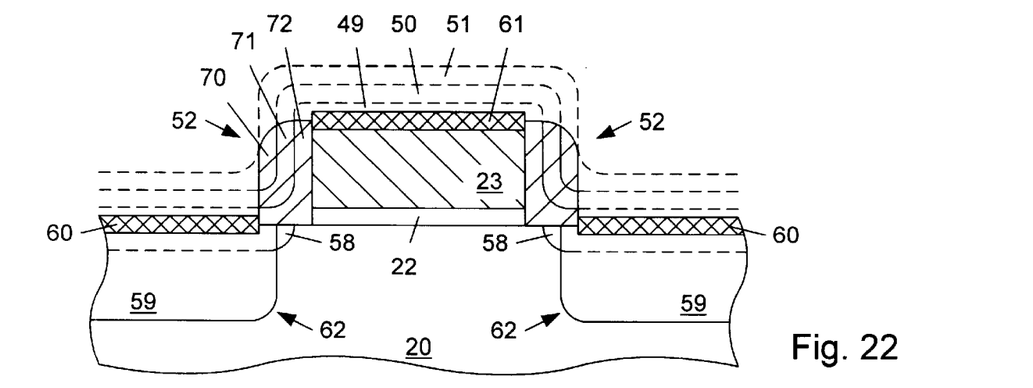
FIG. 22 is a partial cross-sectional view of the semiconductor topography in an alternate embodiment, wherein silicon nitride spacers are formed from deposition and annealing of three successive silicon layers, and wherein impurity distributions are formed before deposition of the second and third silicon layers, and wherein a salicide process is performed after etching to form spacers.

Turning now to FIG. 21, an embodiment is shown in which silicon nitride spacers 52 contain regions 70, 71 and 72 which are remaining portions of silicon nitride layers 49, 50 and 51 respectively. Impurity region 53 is self-aligned to gate conductor 23, while impurity region 54 is created by introducing impurities subsequent to formation of layer 49 and prior to formation of layers 50 and 51. Impurity region 55 is then formed subsequent to formation of layer 50, but prior to formation of layer 51. Impurity region 56 is formed subsequent to formation of layer 51. Portions of layers 49, 50, and 51 (shown by dashed lines) are then selectively removed to form spacers 52 containing regions 70, 71 and 72. As illustrated by this embodiment, impurities may be introduced before and/or after formation of each thin dielectric layer. In the embodiment of FIG. 21, multiple impurity distributions are formed in order to create a graded doping profile. In an alternate embodiment shown in FIG. 22, spacers 52 include silicon nitride regions 70, 71, and 72, formed from silicon nitride layers 49, 50, and 51, respectively, as in FIG. 21. Lightly-doped impurity distributions 58 are introduced subsequent to formation of silicon nitride layer 49, and prior to formation of layers 50 and 51. Heavily-doped impurity distributions 59 are introduced subsequent to formation of layer 50 and prior to formation of layer 51. Impurity distributions 58 and 59 are of opposite type than substrate 20 and combine to form source and drain regions 62 for the transistor. After removal of portions of layers 49, 50, and 51 (shown by dashed lines) to form spacers 52, a salicidation process may be performed. A metal layer may be deposited across upper surfaces of gate conductor 23, spacers 52, and substrate 20. The metal layer may then be reacted with exposed silicon surfaces of gate conductor 23 and substrate 20 to form silicide regions 60 over source and drain regions 62 and silicide region 61 over gate conductor 23. Unreacted metal over spacers 52 may then be removed. In this embodiment, lateral displacement of lightly-doped regions 58 from gate conductor 23 may accommodate impurity diffusion during subsequent processing steps. Lateral displacement of silicide regions 60 from edges of heavily doped impurity distributions 59 may result in higher reliability of a subsequent salicide process by providing a thicker spacer separating gate and source/drain salicide regions, while maintaining a narrow lightly doped portion of the source/drain regions for low series resistance.

Figure 23:
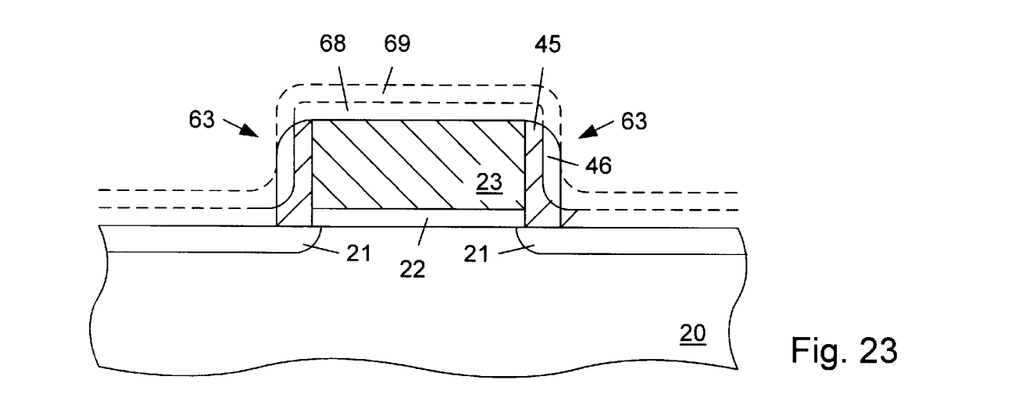
FIG. 23 is a partial cross-sectional view of the semiconductor topography in an alternate embodiment, wherein a silicon nitride layer is formed over the gate conductor and substrate, a silicon dioxide layer is formed over the silicon nitride layer, and both layers are anisotropically etched to form spacers.
Figure 24:
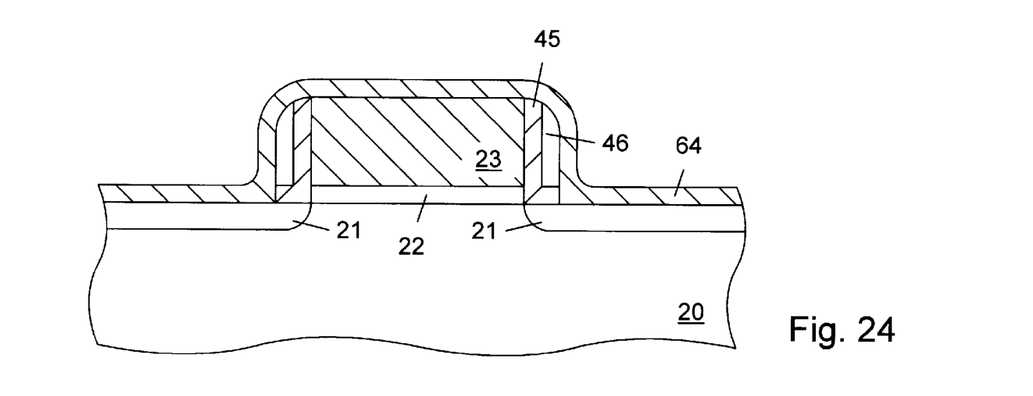
FIG. 24 is a partial cross-sectional view of the semiconductor topography, wherein a thin silicon layer is deposited over the gate conductor, spacers, and substrate, subsequent to the anisotropic etching shown in FIG. 23.
Figure 25:
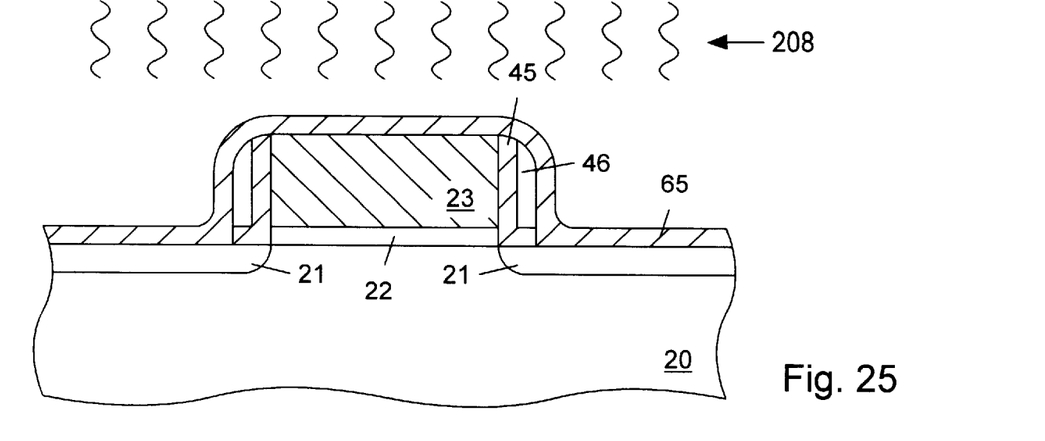
FIG. 25 is a partial cross-sectional view of the semiconductor topography, wherein a thin silicon nitride layer is formed from the thin silicon layer using a thermal process, subsequent to the deposition shown in FIG. 24.
Figure 26:
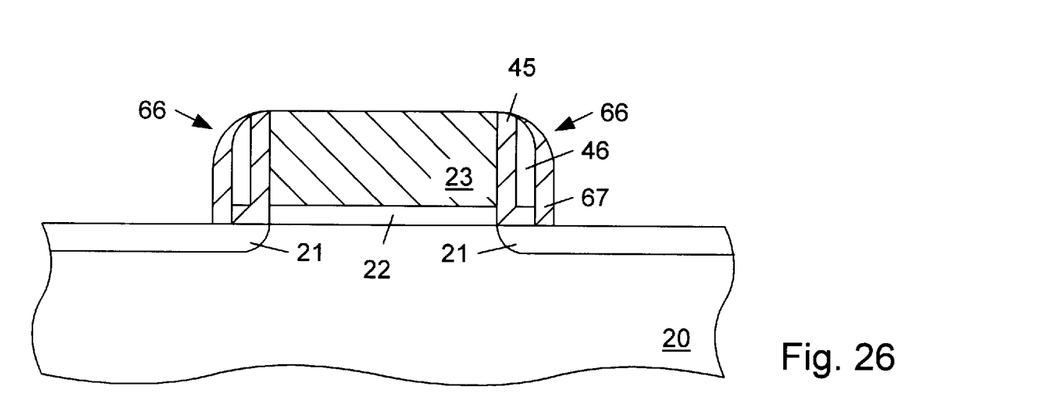
FIG. 26 is a partial cross-sectional view of the semiconductor topography, wherein portions of the thin silicon nitride layer are selectively removed to form a new spacer having a silicon dioxide interior which is substantially surrounded by silicon nitride, subsequent to the thermal process shown in FIG. 25.

Impurity introductions which are masked by vertical portions of dielectric layers formed from deposited silicon layers, as illustrated in the preceding embodiments, may be performed through horizontal portions of the thin dielectric layers, in a manner similar to that shown in FIG. 10. Alternatively, the impurity introductions may be performed after removal of portions of the dielectric layers to form spacers, if such removal is performed between silicon layer depositions. Moreover, spacers including multiple thin dielectric layers as described in some of the above embodiments may be formed by selectively removing portions (preferably by anisotropic etching) of a dielectric layer to form a spacer before deposition of an overlying silicon layer to form an additional dielectric layer, which may then be anisotropically etched. Furthermore, the two techniques (etching after each layer formation, or forming all layers first and then etching) may be combined, as illustrated by FIGS. 23 through 26. In FIG. 23, an embodiment is shown which is similar to that of FIG. 20, except that spacers 63 include two regions, silicon nitride region 45 and silicon dioxide region 46, rather than three regions as in FIG. 20. Regions 45 and 46 of spacers 63 are remaining portions of silicon nitride layer 68 and silicon dioxide layer 69, respectively. To form the topography shown in FIG. 23, silicon nitride layer 68 is formed from a thin silicon layer deposited over gate conductor 23 and substrate 20, preferably by heating in a nitrogen bearing ambient. Silicon dioxide layer 69 is then formed from a second thin silicon layer deposited over silicon nitride layer 68, preferably by heating in an oxidizing ambient. It should be noted that no portions of layer 68 are removed until after formation of layer 69. In this way, "L"-shaped portions of layer 68 remain as regions 45 of spacers 63 after selective removal of portions of layers 68 and 69 (shown by dashed lines). A thin silicon layer 64 is then deposited over upper surfaces of gate conductor 23, spacers 63, and substrate 20, as shown in FIG. 24. Silicon nitride layer 65 is then formed from silicon layer 64 using thermal process 208, as shown in FIG. 25. Portions of layer 65 are then removed to form spacers 66, as shown in FIG. 26. Looking back at FIGS. 23–26, during formation of spacers 66, layer 68 is not etched to form spacers before forming overlying dielectric layers, while each of layers 69 and 65 are etched to form spacers before formation of an overlying layer. In this way, spacers 66 are formed in which interior silicon dioxide regions 46, remaining from etching of layer 69, are almost completely surrounded by silicon nitride regions 45 and 67, remaining from etching of layers 68 and 65. Spacers 66 are believed to be very effective for combining the reliability advantages of silicon nitride with the lower relative permittivity of silicon dioxide, in a similar manner as that described above for the structure of FIG. 20.

It will be appreciated to those skilled in the art having the benefit of this disclosure that this invention is believed to provide a method for forming sidewall spacers containing ultrathin dielectric layers, wherein the dielectric layers are formed by thermal treatment of thin silicon layers. Further modifications and alternative embodiments of various aspects of the invention will be apparent to those skilled in the art in view of this description. For example, the process disclosed here may be used to form a thin silicon nitride spacer adjacent to exposed lateral surfaces of a spacer formed in a conventional manner with a deposited dielectric. In the case of a conventional oxide spacer, this thin nitride layer may provide enhanced reliability on outer surfaces of the combined spacer, by, for example, preventing bridging during a salicide process or protecting against etching of the spacer by agents which etch oxides. In another example, the process disclosed here may be used to form a thin silicon nitride layer adjacent to and below a spacer formed using a deposited dielectric. In this case, the thin silicon nitride layer may provide enhanced reliability by, for example, preventing outdiffusion of impurities from the substrate. It is intended that the following claims be interpreted to embrace all such modifications and changes and, accordingly, the specification and drawings are to be regarded in an illustrative rather than a restrictive sense.

What is claimed is:

1. A transistor, comprising:
   a gate conductor arranged above a semiconductor substrate and between a pair of opposed sidewall surfaces; and
   a spacer arranged laterally adjacent to each of said pair of opposed sidewall surfaces, wherein an uppermost surface of said spacer is substantially even with or below an uppermost surface of said gate conductor, and wherein said spacer consists essentially of a thermally grown-silicon nitride layer having a lateral width at a bottom of said spacer of no more than 200 angstroms.

2. The transistor of claim 1, further comprising a lightly doped portion of a source or drain region arranged within said semiconductor substrate underneath said spacer.

3. The transistor of claim 2, further comprising heavily doped portions of source and drain regions arranged within said semiconductor substrate, said heavily doped portions being laterally spaced outward from said pair of sidewall surfaces by a distance less than or equal to a lateral thickness of said spacer.

4. The transistor of claim 3, wherein an upper portion of said gate conductor comprises a gate silicide, and wherein upper portions of said source and drain regions not covered by said spacers comprise source and drain silicides.

5. The transistor of claim 1, wherein said pair of opposed sidewall surfaces of said gate conductor comprise an insulating dielectric.

6. The transistor of claim 5, wherein said insulating dielectric comprises pad oxide.

7. The transistor of claim 5, wherein said gate conductor further comprises polysilicon.

8. The transistor of claim 1, wherein said spacer does not overlie said uppermost surface of said gate conductor.

9. A transistor, comprising:
   a gate conductor arranged above a semiconductor substrate and between a pair of opposed sidewall surfaces;
   a first spacer laterally adjacent to each of said pair of opposed sidewall surfaces, wherein an uppermost surface of said first spacer is substantially even with an uppermost surface of said gate conductor, and wherein said first spacer comprises an insulating dielectric; and
   a second spacer laterally adjacent to said first spacer, wherein an uppermost surface of said second spacer is substantially even with an uppermost surface of said gate conductor, and wherein said second spacer consists essentially of a thermally-grown silicon nitride layer having a lateral width at a bottom of said second spacer of no more than 200 angstroms.

10. The transistor of claim 9, wherein said first spacer comprises pad oxide.

11. The transistor of claim 9, wherein said first and second spacers do not overlie said uppermost surface of said gate conductor.

12. A transistor comprising a spacer arranged laterally adjacent to each of a pair of opposed sidewall surfaces of a gate conductor, wherein an uppermost surface of said spacer is substantially even with or below an uppermost surface of said gate conductor, and wherein said spacer comprises:
    a first thermally-grown silicon nitride layer;
    a silicon dioxide layer extending across a portion of the first silicon nitride layer; and
    a second thermally-grown silicon nitride layer extending across a portion of the silicon dioxide layer.

13. The transistor of claim 12, wherein a thickness of said first silicon nitride layer is less than or equal to about 200 angstroms.

14. The transistor of claim 13, wherein a thickness of said second silicon nitride layer is less than or equal to about 200 angstroms.

15. The transistor of claim 12, wherein said silicon dioxide layer comprises thermally-grown silicon dioxide.

16. The transistor of claim 12, further comprising a lightly doped portion of a source or drain region arranged within said semiconductor substrate underneath said spacer.

17. The transistor of claim 16, further comprising heavily doped portions of source and drain regions arranged within said semiconductor substrate, said heavily doped portions being laterally spaced outward from said pair of sidewall surfaces by a distance less than or equal to a lateral thickness of said spacer.

18. The transistor of claim 17, wherein an upper portion of said gate conductor comprises a gate silicide, and wherein upper portions of said source and drain regions not covered by said spacers comprise source and drain silicides.

19. The transistor of claim 12, wherein:

said first silicon nitride layer comprises a substantially horizontal nitride portion and a substantially vertical nitride portion, wherein said horizontal nitride portion forms a lower surface of said spacer, and wherein said vertical nitride portion extends across one of said sidewall surfaces;

said silicon dioxide layer comprises a substantially horizontal oxide portion and a substantially vertical oxide portion, wherein said horizontal oxide portion extends across an exposed surface of said horizontal nitride portion, and wherein said vertical oxide portion extends across said vertical nitride portion; and said second silicon nitride layer extends across an exposed surface of said vertical oxide portion.

20. The transistor of claim 12, wherein:

said first silicon nitride layer comprises a substantially horizontal nitride portion and a substantially vertical nitride portion, wherein said horizontal nitride portion forms a lower surface of said spacer, and wherein said vertical nitride portion extends across one of said sidewall surfaces;

said silicon dioxide layer comprises a substantially vertical oxide layer, wherein said silicon dioxide layer is adjacent to an exposed lateral surface of said vertical nitride portion and; and wherein said silicon dioxide layer is adjacent to an exposed upper surface of said horizontal nitride portion; and said second silicon nitride layer comprises a substantially vertical nitride layer, wherein said second silicon nitride layer extends across an exposed lateral surface of said silicon dioxide layer and across an exposed lateral surface of said horizontal nitride portion; and said silicon dioxide layer and said second silicon nitride layer are each tapered at an end farthest from said semiconductor substrate and curved toward said gate conductor such that said silicon dioxide layer is substantially surrounded by a combination of said first silicon nitride layer and said second silicon nitride layer.

* * * * *